United States Patent

Bell et al.

[19]

[11] Patent Number: 6,160,517
[45] Date of Patent: *Dec. 12, 2000

[54] METHOD AND APPARATUS FOR TESTING ELECTRONIC SYSTEMS USING ELECTROMAGNETIC EMISSIONS PROFILES

[75] Inventors: James S. Bell, Cedar Park; David Staggs, Austin, both of Tex.

[73] Assignee: Dell USA, LLP, Round Rock, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 09/009,398

[22] Filed: Jan. 20, 1998

[51] Int. Cl.[7] .................................................. G01R 31/28
[52] U.S. Cl. ........................................... 343/703; 714/724
[58] Field of Search ..................................... 714/724, 726; 324/95, 96, 750; 340/647; 343/703

[56] References Cited

U.S. PATENT DOCUMENTS

| | | | |
|---|---|---|---|
| 4,091,327 | 5/1978 | Larsen et al. | 324/95 |
| 5,006,788 | 4/1991 | Goulette et al. | 324/95 |
| 5,099,196 | 3/1992 | Longwell et al. | 324/537 |
| 5,214,595 | 5/1993 | Ozawa et al. | 702/58 |
| 5,300,879 | 4/1994 | Masuda et al. | 324/95 |
| 5,406,209 | 4/1995 | Johnson et al. | 324/750 |
| 5,423,028 | 6/1995 | Schieve et al. | 714/42 |
| 5,424,633 | 6/1995 | Soiferman | 324/158 |
| 5,459,675 | 10/1995 | Gross et al. | 702/183 |
| 5,498,968 | 3/1996 | Kjebon | 324/627 |
| 5,504,689 | 4/1996 | Fiebrich et al. | 702/122 |
| 5,530,946 | 6/1996 | Bouvier et al. | 714/23 |
| 5,535,330 | 7/1996 | Bell | 714/36 |
| 5,557,741 | 9/1996 | Jones | 714/43 |
| 5,581,693 | 12/1996 | Pecone | 714/25 |
| 5,631,661 | 5/1997 | Sanchez | 343/703 |
| 5,847,949 | 12/1998 | Jiang | 365/65 |
| 5,920,064 | 7/1999 | Rogers | 324/750 |
| 5,920,539 | 7/1999 | Schell et al. | 369/244 |

OTHER PUBLICATIONS

Tsaliovich, A.; Moncion, D.; Okun, A.; Sinfield, G., "Using GTEM for electromagnetic emission measurements: experiments in test result correlation", Electromagnetic Compatibility, 1994. Symposium Record. Compatibility in the Loop., IEEE International Sympo.

Masuda, K.; Hatakeyama, K.-I.; Koshiji, K.; Shu, E., "Estimation method of electromagnetic wave emission from electronic equipment", Instrumentation and Measurement Technology Conference, 1997. IMTC/97. Proceedings. Sensing, Processing, Networking., IEEE.

*Primary Examiner*—Albert De Cady
*Assistant Examiner*—Guy Lamarre
*Attorney, Agent, or Firm*—Haynes and Boone, LLP

[57] ABSTRACT

A printed circuit board assembly testing device includes a LISN device connected to a power source and to a test enclosure. The test enclosure includes a power supply and a communication port. A signal analyzer is interfaced to the LISN device. A circuit board assembly unit under test is positioned in the test enclosure. A controlling computer is interfaced to the communication port. The controlling computer includes a hard disk storage device having benchmark data stored therein. A communication bus interconnects the controlling computer to the signal analyzer. The unit under test is powered up and emissions data is observed which correlates to activity in the unit under test. The emissions data is compared to the benchmark data and a determination can be made as to whether the observed data meets the benchmark data within an acceptable tolerance.

21 Claims, 1 Drawing Sheet

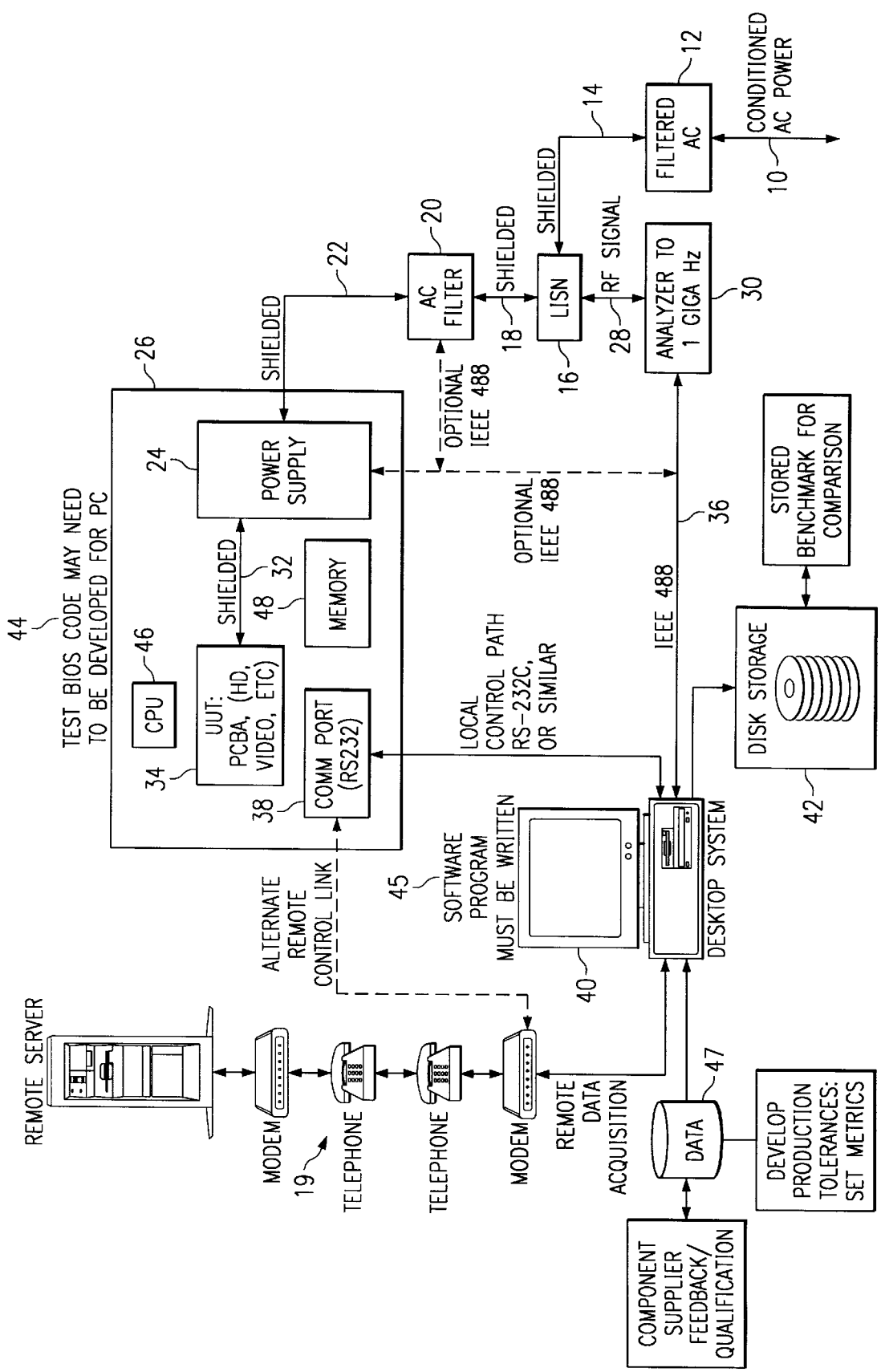

METHOD AND APPARATUS FOR TESTING ELECTRONIC SYSTEMS USING ELECTROMAGNETIC EMISSIONS PROFILES

BACKGROUND

The disclosures herein relate generally to testing electronic equipment and more particularly to a manufacturing test process that utilizes a readable signature of the frequency spectrum measured from the output of the AC power line.

Printed circuit boards (PCB) and printed circuit board assemblies (PCBA) require testing after the components have been affixed on the printed circuit board to determine interconnectional continuity, board functionality, and placement and connection of components. Several different approaches have been developed for testing PCBA's including, for example, functional testing, in-circuit testing, and continuity testing.

A common in-circuit testing technique to individually test each of the components on a printed circuit board is a "bed-of-nails" technique. The bed-of-nails technique uses fixed position spring-loaded probes to establish an electrical contact between test points on a PCB and the test equipment. The fixed-position spring-loaded pins (the "nails") are supported within a frame (the "bed") and connected to the test equipment via individual cables. Each particular bed-of-nails fixture is specially designed and manufactured with an appropriate number of pins suitably positioned to perform specific tests on a particular type of PCB. The design and manufacture of such fixtures is well established in the art. In general, when the board is first placed in the test fixture, it is not in contact with the test probes.

A known approach for bringing the printed circuit board into contact with the test probes is a vacuum assist method. The vacuum assist method forces connections between the PCB circuitry and the circuitry of the tester bed-of-nails by creating a vacuum between the PCB and the test probes. The vacuum provides the large amount of force necessary to overcome the spring pressures of a hundred or more individual probes.

Most commercially available test fixtures use a partial vacuum induced in the space between the board and the test bed to bring the board into contact with the probes. To achieve this, a flexible airtight seal is provided around the board. The seal is generally provided by a rubber seal with a spring means of returning the board to the upper position when the vacuum is released.

Although the vacuum assist method is effective in holding the PCB's in place, exclusive use of the vacuum assist method may cause undesired board flex. Excessive board flex is especially likely if the test probes are not evenly distributed about the total printed circuit board area. Board flex and subsequent associated failures can increase to a point of creating long-term reliability problems as a result of using vacuum pull down methods.

Thus, there is a trend to use mechanical hold-down fixtures to increase throughput and reliability of the bed-of-nails fixture. A mechanical hold-down fixture uses a hold-down gate, which includes a framework which is hinged and attached to a bed-of-nails fixture. The mechanical hold-down fixture pivots for inserting the PCB into and removing the PCB from the test fixture. The mechanical hold-down gate includes a plurality of parallel, sturdy bars. Hold-down fingers are located in channels within the bars.

Functional Testing is also sometimes implemented using a hot mock-up (HMU) technique. This method of test oftentimes uses a system-level testing platform with most common subassemblies connected together in order to assist in the determination of the unit under test (UUT) functionality. As an example, in the isolated case of a personal computer (PC) system, the main electronic logic assembly would commonly be connected manually to cables which connect to peripheral devices such as power supply, floppy disk, hard disk, memory modules, CPU modules, video monitor, keyboard, mouse, etc. Once the required hardware was completely connected, the mock-up would be powered on, diagnostics would be executed and the testing would usually result in a "pass" or "fail" status.

Functional testing can sometimes also be conducted using the bed-of-nails approach. Depending upon the development effort involved, this method can allow for a similar test to the HMU, but with improved throughput capabilities.

In both cases, HMU and bed-of-nails functional testing, a disk operating system (DOS) is read into memory and executed. Disk based diagnostics are usually then executed and after some amount of time and possible manual interactions with the diagnostics programs, a result of "Pass" or "Fail" is determined, (after which the HMU setup must be manually disassembled).

The amount of time spent in functional testing can range from only 3 or 4 minutes upward to hours or days depending upon the UUT intended end-use environment. In the case of the main logic assembly of a PC mentioned previously, the time for a HMU test may take 10 to 12 minutes on average depending upon the diagnostics executed and manual labor involved. The same functional test time for a bed-of-nails version of the same HMU test will usually average 6 minutes.

The amount of functional test time is extensive in a high volume production environment, both at the PCB manufacturing level and at the system level of assembly. This test time equates to a dollar expenditure in capital overhead and any reduction of test time with the same or better functional test coverage will equate with better Return On Invested Capital and overall profitability.

SUMMARY

One embodiment, accordingly, provides a manufacturing test apparatus and method that utilizes a readable signature of the frequency spectrum which results from the operation of an electronic assembly under test. To this end, a device for testing electronic assemblies comprises an electromagnetic emissions compliance testing device connected to a power source. A test enclosure contains the testing device. The test enclosure includes a power supply and a communication port. A signal analyzer is also interfaced to the testing device. A controlling computer is interfaced to the communication port. The controlling computer includes a storage device having benchmark data stored therein. A communication bus connects the controlling computer to the signal analyzer.

A principal advantage of this embodiment is that test time is reduced and test results are improved to provide a competitive advantage over standard product acceptance methods, which can reduce the overall cost of the electronic assembly price. A "pass" or "fail" determination is provided in a reduced time when compared to present known test methods.

BRIEF DESCRIPTION OF THE DRAWINGS

FIG. 1 is a schematic view illustrating an embodiment of a test device for utilizing a readable signature of the frequency spectrum of an electronic assembly being tested.

DETAILED DESCRIPTION OF THE PREFERRED EMBODIMENT

Referring to FIG. 1, illustrated is an AC power source 10 being filtered at 12 and shielded at 14 and connecting to a line impedance stabilization network (LISN) device 16. Alternately, a gigahertz transverse electromagnetic cell (GTEM) device or an electromagnetic scanning (EMSCAN) device may potentially be applied instead of a LISN device but at a great cost disadvantage. The LISN device 16 operates with an upper frequency detection range of approximately 1 GHz. The LISN device 16 passes AC though shielded wires at 18, through an AC filter 20, through more shielded wires at 22 to a power supply 24 which is contained within a test enclosure 26. The LISN device 16 also interfaces via shielded RF signal wire 28 or via optical means to a signal analyzer device 30.

Within the enclosure 26 is contained the power supply 24 connected to the AC source 10 which in turn is connected via shielded cables 32 to a UUT 34. The power supply 24 is, in the preferred embodiment, a programmable device capable of interfacing to an IEEE 488 bus 36. The power supply 24 is used to power the UUT 34 and its peripherals, if any. The UUT peripherals, if any, would be "golden", or stated differently, would commonly remain as a permanent part of the enclosure 26 in order to reduce and eliminate variability from one tested UUT 34 to the next.

The peripherals are connected or inserted into the UUT 34. In the example of UUT 34 being a PC main logic board, it is assumed that there exist communications ports usable to interface control and data into and out of the enclosure 26 during testing (or between individual tests), and if not, a means of doing such would be provided for within the enclosure 26. An example of a communications port is an RS232 serial port 38, or other communications capable I/O port. The communications port 38 interfaces through the enclosure 26, possibly optically isolated, to an external controlling computer system 40, having an HD disk storage 42 capable of storing many spectral RF data patterns.

The controlling computer system 40 may also interface with other computer systems generally designated 19 via network either locally or remotely. This would allow for remote control and diagnostics capability, upload of new programs or download of data to a central location.

Up to this point in the description of the preferred embodiment, all devices are commercially available off-the shelf devices. Custom work may potentially exist in generation of a software source code 45 used on the controlling computer system 40 in the form of commercially available software development packages. A customized test BIOS 44 (in the case of a PC main logic board) may be advantageous in performing stop/start functions in capturing frequency radiation plots from the signal analyzer 30. A simple BIOS implementation would single-step BIOS POST routines with inserted delays between test steps for the purpose of easily identifying test steps represented in captured spectral data.

The final hardware connection is to the IEEE 488 bus 36 connecting the controlling PC system 40 to the signal analyzer 30 and to the optionally programmable power supply 24. In a production environment where large numbers of such testers may reside, other interfacing techniques may be able to reduce costs, such as through the use of wireless networking methods. Because a major concern of the functional testing deals with the faster and faster frequencies of new technology circuits, this embodiment evaluates the acceptance or nonacceptance of the UUT 34 in those terms precisely.

While most of the components that comprise the acceptance testers hardware are "off-the-shelf" items, and also are intended for use in test environments, the method of testing, and the application of the components into a production setting which in turn results in product cost savings, is unique. This embodiment implements a production manufacturing test process that utilized a readable signature of the frequency spectrum that results from the operation, at speed, of the UUT 34, rather than using the normal HMU or bed-of-nails functional test. This method of test could result in an overall test time of 1 minute or less, and take substantially less time than the current art at a reduced hardware cost.

The LISN device 16 offers the most cost effective capability to capture a signature profile of a conducted electromagnetic emissions profile that is generated by the UUT 34. The LISN device 16 has most commonly been used in the testing and certification of systems, that exhibit emissions that contain information, which are commonly required by governmental agencies in critical security applications, thus the capabilities of the LISN device 16 are well known by those familiar with the art. The LISN device 16 has a standard impedance, over a very wide frequency range, thus variability is reduced in a test environment.

In a production setting used as a PCBA test instead of the HMU test, the LISN device 16 resides in shielded enclosure 26. The UUT 34 is populated with a CPU 46 and a memory 48 of a standard configuration for the purposes of test only. The UUT 34 is introduced to the shielded enclosure 26, input power is filtered and conditioned to prevent outside frequencies from interfering with the test operations, and power is applied to the UUT 34. External control of the LISN device 16 is possible via computer system 40 using control program 45 via the IEEE-488 bus 36 interface to allow for test programmability and repeatability. A "golden profile" of the conducted emissions profile is captured for a specific period or specific periods of time while the UUT 34 is performing digital tasks.

Comparisons of conducted emissions profiles for the UUT's 34 to the "golden profile" are performed. Windows of acceptability can be programmed. Minor variations of many UUTs 34 can be handled using a +/−3 sigma from mean distribution to identify "reliability risk" units that otherwise may fall within the design acceptability limits. Conducted emissions profiles that compare favorably to the "golden profile" pass the go/no-go test, and those that do not compare favorably, fail the go/no-go test. As mentioned above, the "golden profile" may be modified over time by the externally controlling PC system 40 which would account for minor and acceptable shifts in component specifications from board to board.

In operation, a UUT 34 such as a PC logic board, is loaded into the enclosure 26 with its peripherals, if any, and connected to the power source 10. The software program 45 controlling PC system 40 ensures signal analyzer 30 and power supply 24 are on-line and ready. The controller initiates power "on" to UUT 34. Test BIOS 44 single steps through POST routines and has inserted software delays after completion of each POST step for known time duration (for the purpose of ease of identification of test steps only). The controlling PC system 40 is capable of issuing modified POST routines to the UUT 34 as disclosed in U.S. Pat. No. 5,535,330 titled "SYSTEM AND METHOD FOR ERROR LOCATION IN PRINTED WIRE ASSEMBLIES BY EXTERNAL POWER ON SELF TEST (POST) COMMANDS", and incorporated herein by reference.

Controlling PC system 40 is capable of looking for POST step completion signals from the BIOS 44 running in the UUT 34. The RF signatures of each POST are capable of being captured by the signal analyzer 30 that is connected to the constant impedance LISN device 16 which in turn is connected to the AC source 10. The signal analyzer 30 is observing and capturing conducted emissions on the AC lines that correlate to the activity taking place in the UUT 34. The captured signatures are compared to stored signatures of known good passed main logic boards. Production tolerance metrics are developed over a short time span using stored spectral data 47 of both passed and failed test results. Failures are recorded on disk with results that can be utilized as predictive tools, pareto yield reports, etc. Specific tests can be developed that pinpoint critical RF components in order to ensure ongoing RF compliance.

Although a video terminal may not be connected to the UUT 34, spectral data can confirm the operation of any individual gate on the UUT 34 under the control of the external controlling PC system 40 via the communications port 38 connection and customized testing BIOS 44, including any on-board video circuitry and associated memory.

As it can be seen, the principal advantages of this embodiment are that it provides a go/no-go functional test utilized for product acceptance purposes with reduced test times and potentially increased coverage levels; a reliability prediction tool; an ongoing emissions compliance tool; a product development enhancement tool; and long-term ongoing feedback of data over many production units providing assembly and design trend data for analysis. Further advantages include the capability of identifying functional failures of sub-areas within a UUT to substantiate continued RF emissions compliance from assembly to assembly; to provide for direct RF comparisons to be performed relative to a clock signal to be made in a production environment; to provide for sections of the RF spectrum to be compared in a production setting; to digitize the RF signatures for later comparison and analysis; and to take stored (on HD or in other non-volatile memory) spectral data and compare it to UUT spectral data while allowing for a minimal tolerance to be present.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. A device for testing electronic assemblies comprising:
   an electromagnetic emissions compliance testing device connected to a power supply;
   a test enclosure for housing a UUT to be tested for RF emissions, the test enclosure including a power supply and a communication port;
   a PC system coupled to the test enclosure;
   a signal analyzer coupled to the PC system including stored spectral data;
   a constant impedance LISN device coupled to the test enclosure and to the signal analyzer;
   a test BIOS controlled by the PC system for single stepping through a POST routine issued to the UUT;
   each POST step including an RF emission signature;
   the PC system being provided to look for a POST step completion signal from the BIOS;
   the signal analyzer being provided to capture an RF emission signal from the UUT and the RF emission signature of each POST step; and
   the test enclosure being coupled to the signal analyzer for external control by the PC using the stored spectral data to compare the RF emission signal from the UUT and the RF emission signature of each POST step to determine pass/fail test compliance.

2. The device as defined in claim 1 wherein the power source is an AC power source which is filtered and shielded.

3. The device as defined in claim 1 wherein the testing device passes AC power through an AC filter to the power supply.

4. The device as defined in claim 1 wherein the testing device interfaces via shielded RF signal wire to the signal analyzer.

5. The device as defined in claim 1 wherein the testing device interfaces with the power supply via a shielded connection.

6. The device as defined in claim 1 wherein the test enclosure interfaces with the testing device via a shielded connection.

7. The device as defined in claim 1 wherein the power supply is programmable.

8. The device as defined in claim 7 wherein the power supply is coupled to a communication bus connecting the PC system to the signal analyzer.

9. The device as defined in claim 1 wherein the PC system is coupled to another computer system via a computer network.

10. The device as defined in claim 1 wherein the PC system is coupled to a remote computer system.

11. A printed circuit board assembly testing device comprising:
    an electromagnetic emissions compliance testing device connected to a power supply;
    a test enclosure for housing a UUT to be tested for RF emissions; the test enclosure including a power supply and a communication port;
    a PC system coupled to the test enclosure;
    a signal analyzer coupled to the PC system including stored spectral data;
    a communication bus connecting the PC system to the signal analyzer;
    a software program coupled to control the PC system;
    a constant impedance LISN device coupled to the test enclosure and to the signal analyzer;
    a test BIOS controlled by the PC system for single stepping through a POST routine issued to the UUT;
    a software delay after completion of each POST step;
    the PC system being provided to look for a POST step completion signal from the BIOS;
    the signal analyzer being provided to capture an RF emission signal from the UUT and an RF emission signature of each POST step; and
    the enclosure being coupled to the signal analyzer for external control by the PC system using the software program and the stored spectral data to compare the RF emission signal from the UUT and the RF emission signature of each POST step to determine whether the UUT passes a go/no-go test.

12. The device as defined in claim 11 wherein the power source is an AC power source which is filtered and shielded.

13. The device as defined in claim 11 wherein the testing device passes AC power through an AC filter to the power supply.

14. The device as defined in claim 11 wherein the testing device interfaces via shielded RF signal wire to the signal analyzer.

15. The device as defined in claim 11 wherein the testing device interfaces with the power supply via a shielded connection.

16. The devices as defined in claim 11 wherein the test enclosure interfaces with the testing device via a shielded connection.

17. The device as defined in claim 11 wherein the power supply is programmable.

18. The device as defined in claim 11 wherein the power supply is coupled to the communication bus.

19. The device as defined in claim 11 wherein the PC system is coupled to another computer system via a computer network.

20. The device as defined in claim 11 wherein the PC system is coupled to a remote computer system.

21. A method of testing electronic assemblies, comprising the steps of:

connecting a test enclosure to an electromagnetic emissions compliance testing device, the test enclosure housing a UUT to be tested for RF emissions; the test enclosure including a power supply and a communication port and being connected to a power supply;

interfacing a PC system to the test enclosure;

interconnecting the PC system with a signal analyzer via a communication bus;

providing a software program coupled to control the PC system;

loading the UUT to be tested, into the test enclosure;

coupling the UUT to the signal analyzer and the test enclosure for external control by the PC system using the software program;

powering up the UUT;

single stepping a test BIOS, controlled by the PC system, through a POST routine issued to the UUT;

delaying after each POST step for a known time duration;

providing the PC system to look for a POST step completion signal from the BIOS;

capturing an RF emission signal from the UUT and an RF emission signature of each POST step by the signal analyzer;

connecting the signal analyzer to a constant impedance LISN device;

observing the RF emission signal correlating to activity in the powered up UUT;

comparing the observed RF emission signal from the UUT with the RF emission signature from each POST step; and determining whether the RF emission signal from the UUT meets an acceptable tolerance.

* * * * *